United States Patent
Takahashi

(10) Patent No.: US 8,284,583 B2
(45) Date of Patent: Oct. 9, 2012

(54) SEMICONDUCTOR MEMORY WITH SENSE AMPLIFIER AND DRIVER TRANSISTOR ROWS

(75) Inventor: Hiroyuki Takahashi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 433 days.

(21) Appl. No.: 12/501,705

(22) Filed: Jul. 13, 2009

(65) Prior Publication Data

US 2010/0034006 A1     Feb. 11, 2010

(30) Foreign Application Priority Data

Aug. 7, 2008  (JP) .................................. 2008-204060

(51) Int. Cl.
*G11C 5/02*     (2006.01)

(52) U.S. Cl. ......................................... 365/51; 365/214

(58) Field of Classification Search ........... 365/189.011, 365/51, 207, 214
See application file for complete search history.

(56) References Cited

U.S. PATENT DOCUMENTS

| | | | | |
|---|---|---|---|---|
| 5,822,262 A * | 10/1998 | Hashimoto et al. | ........... | 365/207 |
| 6,879,539 B2 * | 4/2005 | Kawasaki | ............... | 365/230.03 |
| 6,973,002 B2 * | 12/2005 | Hara et al. | ..................... | 365/205 |
| 7,158,430 B2 | 1/2007 | Byun | | |
| 7,298,660 B2 * | 11/2007 | Byun | ............................ | 365/205 |

FOREIGN PATENT DOCUMENTS

JP    2004-221374     8/2004

OTHER PUBLICATIONS

Chinese Official Action—200910166010.1—Jul. 17, 2012.

* cited by examiner

*Primary Examiner* — Tuan T Nguyen
*Assistant Examiner* — Lance Reidlinger
(74) *Attorney, Agent, or Firm* — Young & Thompson

(57) ABSTRACT

In an exemplary aspect, the present invention provides a semiconductor memory device including sense amplifiers that drive bit lines to which memory cells are connected, and driver transistors that supply a power supply to the sense amplifiers, wherein the sense amplifiers are arranged in rows and constitutes a first sense-amplifier row in which transistors of a first conductive type are arranged and a second sense-amplifier row in which transistors of a second conductive type are arranged, and the driver transistors constitutes at least one transistor row including a first driver transistor of the first conductive type corresponding to the first sense-amplifier row and a second driver transistor of the second conductive type corresponding to the second sense-amplifier row between the first sense-amplifier row and the second sense-amplifier row.

19 Claims, 12 Drawing Sheets

SEMICONDUCTOR MEMORY WITH SENSE AMPLIFIER AND DRIVER TRANSISTOR ROWS

BACKGROUND

1. Field of the Invention

The present invention relates to a semiconductor memory device.

2. Description of Related Art

Conventionally, DRAM (Dynamic Random Access Memory) circuits have been known as semiconductor memory devices. FIG. 10 shows schematic plane view of a DRAM circuit chip 1. As shown in FIG. 10, the DRAM circuit chip 1 is composed of memory array regions 2, sense-amplifier regions 3, word-line driver regions 4, and intersection regions 5. The memory array regions 2 have a plurality of memory cells arranged in a matrix. A word line and a bit line are connected to each memory cell. The word line is driven by a word-line driver located in the word-line driver region 4. The bit line is connected to a sense-amplifier circuit located in the sense-amplifier region 3, and the sense-amplifier amplifies a potential between a pair of bit lines. The intersection regions 5 are regions at which the sense-amplifier regions and the word-line driver regions 4 intersect each other.

In recent years, the reduction of chip areas has been desired in semiconductor memory devices in order to downsize the devices and lower the manufacturing costs. Japanese Unexamined Patent Application Publication No. 2004-221374 (Patent document 1) discloses a semiconductor memory device as a technique to reduce the chip area. The object of the semiconductor memory device disclosed in Patent document 1 is to reduce the size of sense-amplifier regions between memory cell arrays, i.e., regions corresponding to the sense-amplifier regions 3 in FIG. 10.

FIG. 11 shows a schematic plane view in and around a sense-amplifier region 3 of a DRAM circuit chip 10 of a semiconductor memory device disclosed in Patent document 1. Furthermore, FIG. 12 shows a circuit diagram of a typical sense amplifier, which is also used in Patent document 1. Firstly, the circuit configuration of a sense amplifier SA1 shown in FIG. 12 is explained hereinafter. As shown in FIG. 12, the sense amplifier SA1 includes PMOS transistors QP1 and QP2, and NMOS transistor QN1 and QN2. Since the sense amplifier SA1 is a typical sense amplifier and its operation and configuration are well known, its explanation is omitted. The source of each PMOS transistors QP1 and QP2 of the sense amplifier SA1 is connected to a node A. The source of each NMOS transistors QN1 and QN2 is connected to a node B. Sense amplifiers SA2, . . . , each of which has a similar configuration to that of the sense amplifier SA1, are also connected between these nodes A and B. Furthermore, a PMOS transistor QP3 is connected between a power-supply voltage terminal VDD and the node A. An NMOS transistor QN3 is connected between a ground voltage terminal GND and the node B. These PMOS transistor QP3 and NMOS transistor QN3 are driver transistors that drive the sense amplifiers SAT, SA2, . . . . Note that sense-amplifier control signals SEP and SEN are input to the PMOS transistor QP3 and NMOS transistor QN3 respectively in order to control their On-states and Off-states.

A boundary line 50 in FIG. 11 separates an N-well region 20, above which the above-described PMOS transistors QP1 to QP3 are formed, from a P-well region 30, above which the above-described NMOS transistors QN1 to QN3 are formed. Note that in practice, the boundary line 50 is formed as an element separation region composed of a silicon dioxide film or the like. The PMOS transistors QP1 and QP2 shown in FIG. 12 are formed in regions 21 in FIG. 11. Furthermore, the PMOS transistor QP3 is formed in a region 22 in FIG. 11. Meanwhile, the NMOS transistors QN1 and QN2 shown in FIG. 12 are formed in regions 31 in FIG. 11. Furthermore, the NMOS transistor QN3 is formed in a region 32 in FIG. 11. Furthermore, contacts 41 and 42 that supply well potentials to the respective wells are formed between the driver transistors. By using such a configuration, the width L10 of the sense-amplifier region 3 is shortened and thus reducing the size of the sense-amplifier region 3.

Furthermore, Patent document 1 also discloses another technique in which the size of the sense-amplifier regions 3 is reduced by disposing the driver transistors in the intersection regions 5 of the sense-amplifier regions 3.

SUMMARY

However, there is a problem in Patent document 1 that dead space is generated between driver transistors in each well, and therefore the reduction of the size of the sense-amplifiers 3 is unsatisfactory. Especially, the dead space in the P-well region 30 becomes significantly larger because a smaller area is required for the region 32 in which an NMOS transistor QN3 is formed than that for the region 22 in which a PMOS transistor QP3 is formed owing to difference in the carrier mobility and the like.

Furthermore, even when driver transistors are disposed in the intersection regions 5, the size of those intersection regions 5 needs to be increased. As a result, there is a possibility that their pitch does not match with the pitch of the word-line drivers and the likes formed in the word-line driver regions 4 and thus generating additional dead space in the word-line driver regions 4. Furthermore, the wiring resistance between a driver transistor located in the intersection region 5 and a sense-amplifier transistor becomes larger due to the longer distance therebetween, and thus deteriorating the characteristics of the sense amplifier. Therefore, it has been desired to provide a configuration in which the circuit area can be reduced while the driver transistors are disposed in the sense-amplifier regions 3.

A first exemplary aspect of an embodiment of the present invention is a semiconductor memory device including: sense amplifiers that drive bit lines to which memory cells are connected; and driver transistors that supply a power supply to the sense amplifiers, wherein the sense amplifiers are arranged in rows and constitutes a first sense-amplifier row in which transistors of a first conductive type are arranged and a second sense-amplifier row in which transistors of a second conductive type are arranged, and the driver transistors constitutes at least one transistor row including a first driver transistor of the first conductive type corresponding to the first sense-amplifier row and a second driver transistor of the second conductive type corresponding to the second sense-amplifier row between the first sense-amplifier row and the second sense-amplifier row.

Another exemplary aspect of an embodiment of the present invention is a semiconductor memory device including: a sense-amplifier row arranged in a first direction; a driver-transistor row that supplies a voltage to the sense-amplifier row, the driver-transistor row being arranged in parallel with the first direction; and an element separation region continuously extending from the first direction so as to cross the driver transistor row in a direction intersecting the first direction.

In accordance with an exemplary aspect of the present invention, the first driver transistor and the second driver transistor are lined up in a row between the first sense-amplifier row and the second sense-amplifier row. Therefore, the distance between the first sense-amplifier row and the second sense-amplifier row, which sandwich the transistor row of the first and second driver transistors used to supply the power supply to the first and second sense-amplifier rows therebetween, can be shortened.

In accordance with a semiconductor memory device in accordance with an exemplary aspect of the present invention, the size of the sense-amplification region can be reduced without causing the problem that the wiring resistance between a transistor of a sense amplifier and a driver transistor becomes larger.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

First Exemplary Embodiment

Figure 1:
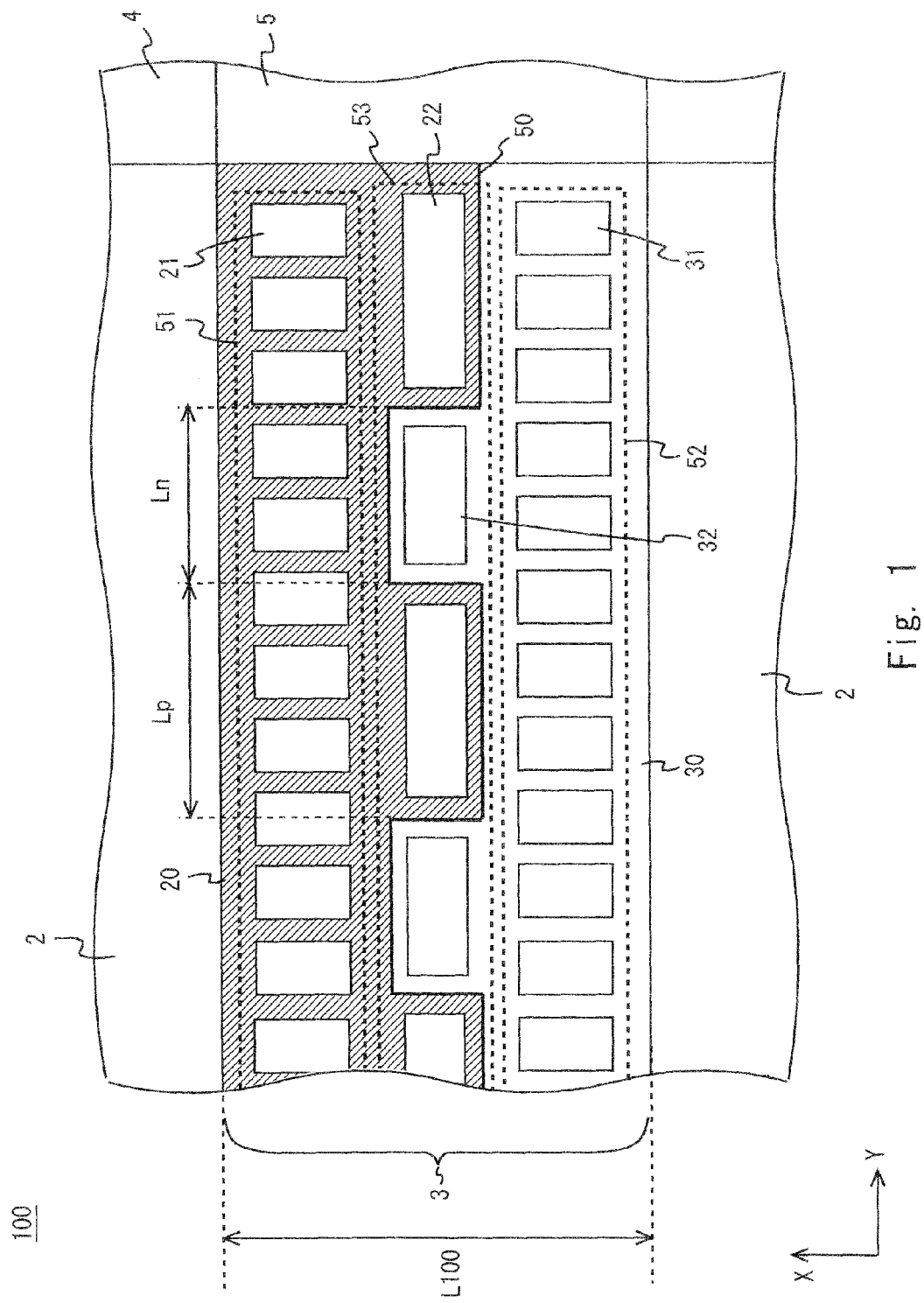
FIG. 1 shows an example of a configuration of a semiconductor memory device in accordance with a first exemplary embodiment of the present invention.
Figure 10:
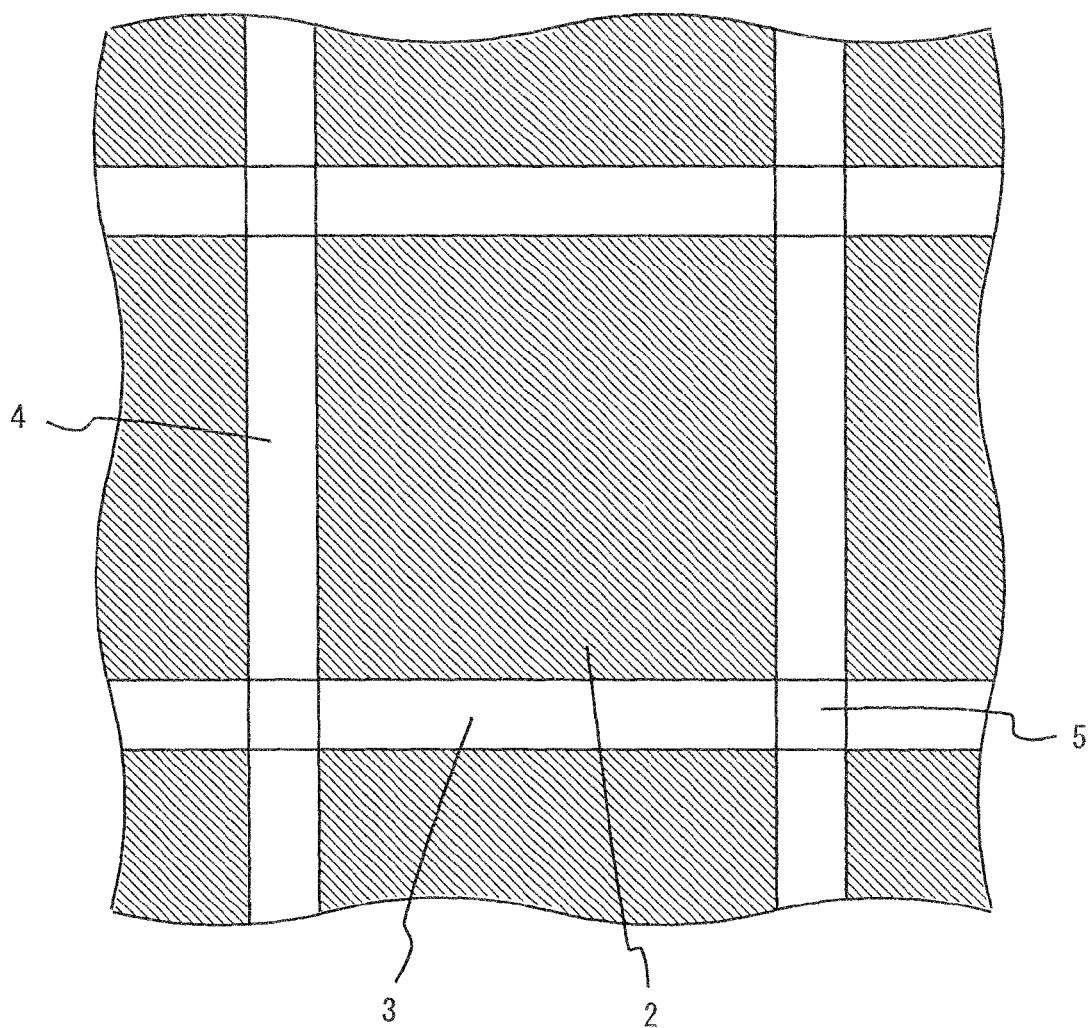
FIG. 10 is a schematic diagram of a configuration of a typical DRAM circuit.
Figure 12:
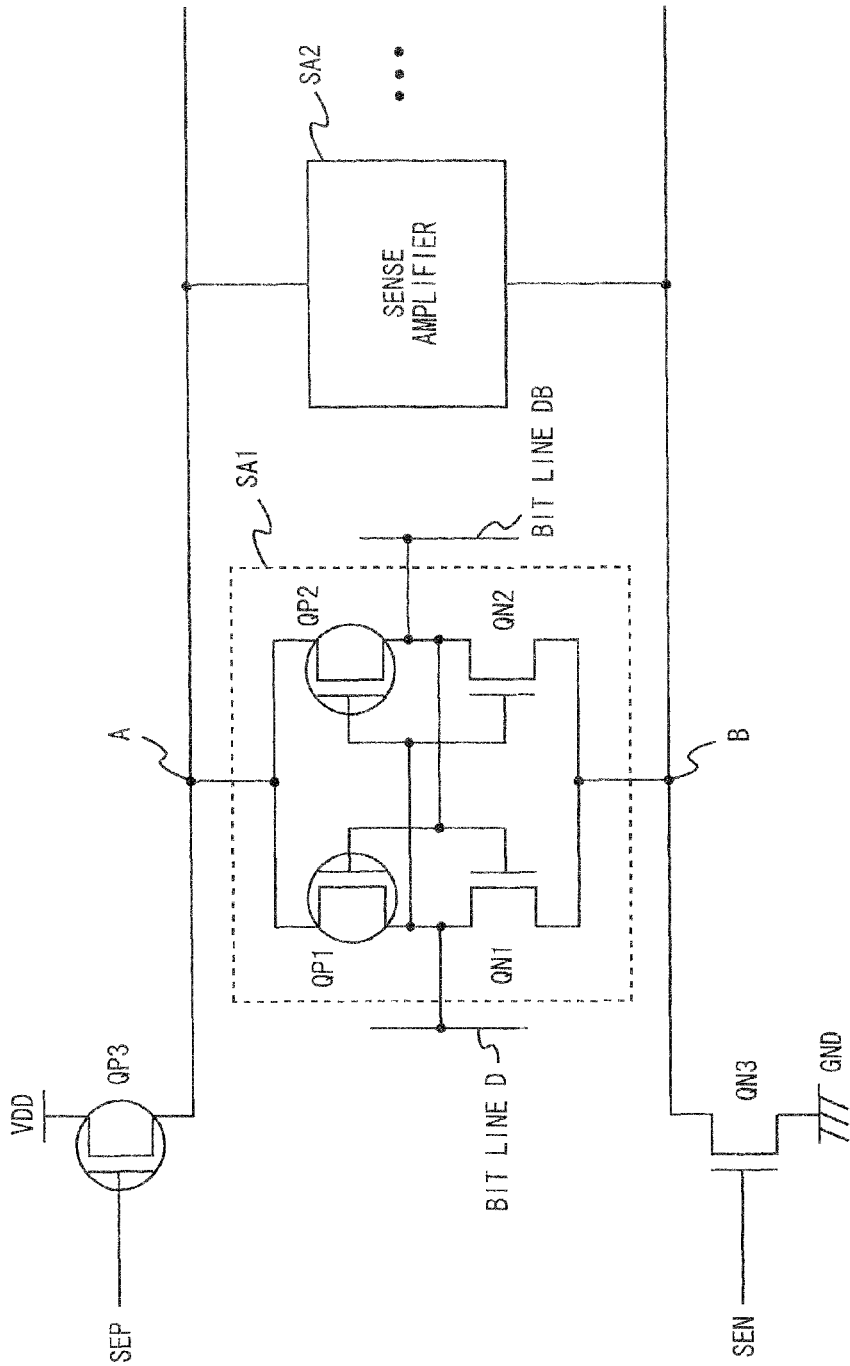
FIG. 12 is a circuit diagram of a typical sense amplifier.

A specific first exemplary embodiment to which the present invention is applied is explained hereinafter in detail with reference to the drawings. In this first exemplary embodiment, the present invention is applied to a DRAM circuit. FIG. 1 shows an example of a plane configuration diagram of a chip of a DRAM circuit 100 of a semiconductor memory device in accordance with a first exemplary embodiment of the present invention. Note that FIG. 1 shows a schematic plane view of a sense-amplifier region and a surrounding area of a chip of the DRAM circuit 100, i.e., a region corresponding to the sense-amplifier region 3 and a surrounding area shown in FIG. 10. Also note that components and structures having the same signs as those in FIG. 10 represent identical or similar components and structures to those in FIG. 10. Furthermore, a connection configuration for a plurality of sense amplifiers and driver transistors to drive these sense amplifiers, both of which are formed in the sense-amplifier region 3 shown in FIG. 1, is similar to the connection configuration shown in FIG. 12. Therefore, when the same signs as those in FIG. 12 are used in the following explanation, they indicate the same components or structures.

As shown in FIG. 1, the DRAM circuit 100 includes an N-well region 20 and a P-well region 30 in the sense-amplifier region 3 of the chip.

The N-well region 20 includes PMOS transistor regions 21 and 22 in which PMOS transistors are formed. PMOS transistors QP1 and QP2 as shown in FIG. 12 are formed in PMOS transistor regions 21. A PMOS transistor QP3 as shown in FIG. 12, which is a driver transistor, is formed in a PMOS transistor region 22. Each of the PMOS transistors QP1 to QP3 is composed of a gate electrode (not shown) formed over the N-well region 20 with a gate oxide film (not shown) interposed therebetween, and P-type source/drain diffusion regions formed on both sides of the gate electrode.

The P-well region 30 includes NMOS transistor regions 31 and 32 in which NMOS transistors are formed. NMOS transistors QN1 and QN2 as shown in FIG. 12 are formed in NMOS transistor regions 31. A NMOS transistor QN3 as shown in FIG. 12, which is a driver transistor, is formed in an NMOS transistor region 32. Each of the NMOS transistors QN1 to QN3 is composed of a gate electrode (not shown) formed over the P-well region 30 with a gate oxide film (not shown) interposed therebetween, and N-type source/drain diffusion regions formed on both sides of the gate electrode.

Figure 2:
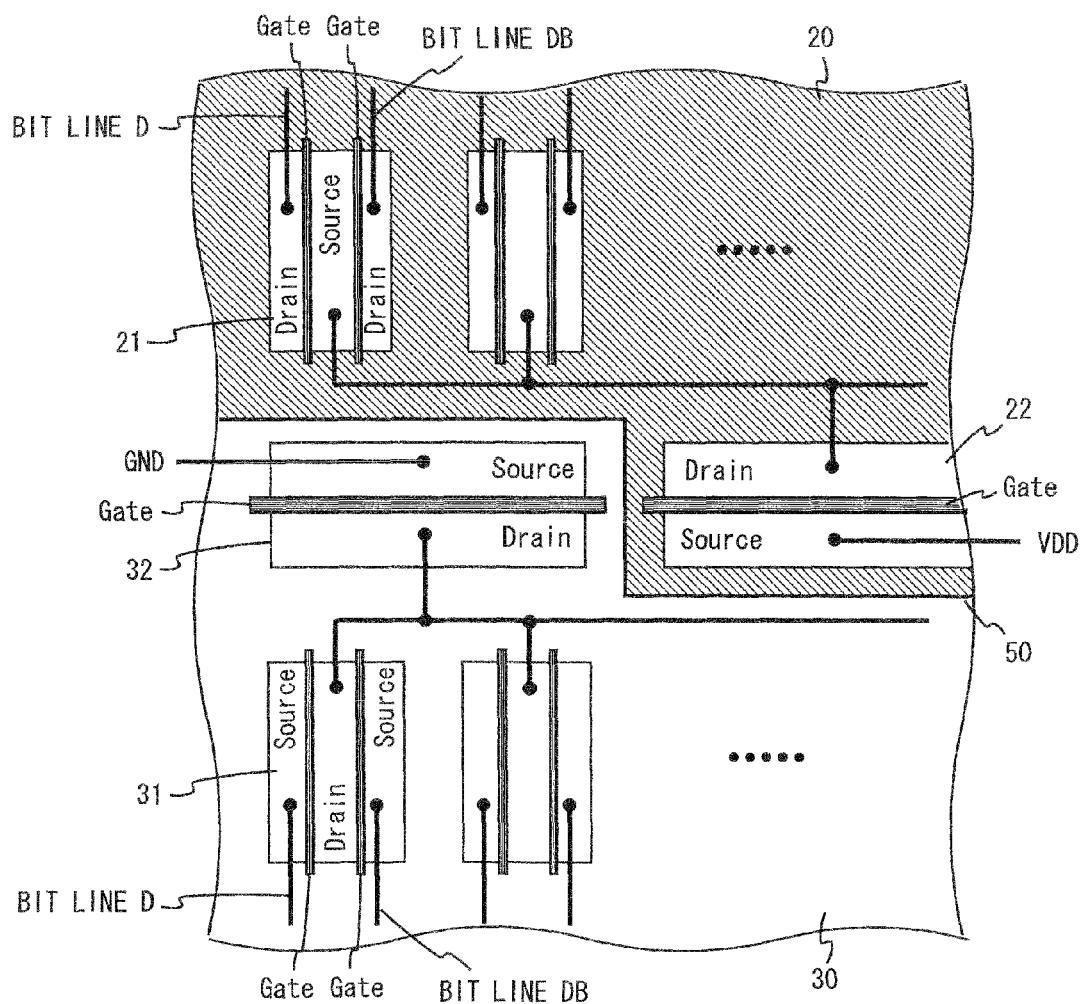
FIG. 2 shows a connection relation of a semiconductor memory device in accordance with a first exemplary embodiment of the present invention.

To explain the connection configuration between each component shown in FIG. 1, FIG. 2 shows a schematic diagram, which is created by enlarging a portion of FIG. 1, of the wiring between each component. As shown in FIG. 2, two PMOS transistors QP1 and QP2 are formed in each PMOS transistor region 21, and thus there are two gate electrodes. A source and a drain are formed on both sides of each gate electrode. However, since the source is shared by these two PMOS transistors, there are two drains and one source. A pair of bit lines D and DB is connected to these two drains.

The gate electrode of the PMOS transistor QP3 exists in the PMOS transistor region 22, and the source and drain are formed on both sides of the gate electrode. A power-supply voltage terminal VDD is connected to this source. The drain is connected to the sources of the above-described transistors formed in the PMOS transistor regions 21. Note that the PMOS transistor QP3 is connected to a predefined number of PMOS transistors QP1 and QP2, and that number is determined by the wiring resistance between the transistors and the driving capability of the PMOS transistor QP3 and the like.

Similarly, two NMOS transistors QN1 and QN2 are formed in each NMOS transistor region 31, and thus there are two gate electrodes. The source and drain are formed on both sides of each gate electrode. However, since the drain is shared by these two NMOS transistors, there are two sources and one drain. A pair of bit lines D and DB is connected to these two drains.

The gate electrode of the NMOS transistor QN3 exists in the NMOS transistor region 32, and the source and drain are formed on both sides of the gate electrode A ground voltage terminal GND is connected to this source. The drain is connected to the drains of the above-described transistors formed in the NMOS transistor regions 31. The NMOS transistor QN3 is connected to a predefined number of NMOS transistors QN1 and QN2, and that number is determined by the wiring resistance between the transistors and the driving capability of the NMOS transistor QN3 and the like.

The N-well region 20 and the P-well region 30 contact with each other on a boundary line 50. The boundary line 50 separates the N-well region 20 from the P-well region 30, and is formed as an element separation region composed of a silicon dioxide film or the like. As shown in FIG. 1, the boundary line 50 has a crank-shape having consecutive L-shapes. This configuration is formed by mutually combining the N-well region 20 having convex-shaped rectangular extension portions with the P-well region 30 also having convex-shaped rectangular extension portions.

In this example, the PMOS transistor regions 21 and the NMOS transistor regions 31 are arranged in the extending direction of the word lines (not shown) formed in the cell array region 2, i.e., in the Y-direction in FIG. 1. In the following explanation, the array of these PMOS transistor regions 21 is referred to as "P-type sense-amplifier array 51", and the array of these NMOS transistor regions 31 is referred to as "N-type sense-amplifier array 52".

The PMOS transistor regions 22 are disposed, in the N-well region 20, between the P-type sense-amplifier array 51 and the N-type sense-amplifier array 52. Similarly, the NMOS transistor regions 32 are disposed, in the P-well region 30, between the P-type sense-amplifier array 51 and the N-type sense-amplifier array 52. Furthermore, the PMOS transistor regions 21 and 22 and the NMOS transistor regions 31 and 32 are arranged at predefined element-intervals. In this way, the PMOS transistor regions 22 and the NMOS transistor regions 32 are arranged in a row in a region denoted as 53 in FIG. 1 (hereinafter called "driver transistor array region"), which is located between the P-type sense-amplifier array 51 and the N-type sense-amplifier array 52. Furthermore, this configuration can be also expressed that "the element separation region indicated as the boundary line 50 is continuously formed so as to cross the driver transistor array region 53, in which the PMOS transistor regions 22 and the NMOS transistor regions 32 are arranged in the Y-direction, in a direction intersecting the driver transistor array region 53, e.g., in the X-direction".

As has been described above, the DRAM circuit 100 in accordance with a first exemplary embodiment of the present invention is formed such that the N-well region 20 and the P-well region 30 contact with each other with a crank-shaped boundary having consecutive L-shapes as shown in FIG. 1. Further, the transistor regions 22 and 32 for the respective transistor types in which the driver transistors QP3 and QN3 respectively are formed are disposed in the regions that have convex shapes as viewed from the opposed well regions. With such a configuration, the transistor regions 22 and 23 are arranged in a row in the driver transistor array region 53 shown in FIG. 1. Furthermore, the lengths of the transistor regions 22 and 32 in the X-direction can be freely established in accordance with the driving capability of the driver transistors QP3 and QN3. To conform to them, the lengths Lp and Ln of the convex-shaped regions of the N-well region 20 and the P-well region 30 shown in FIG. 1 can be also freely established. Therefore, by forming the N-well region 20 and the P-well region 30 with the optimal lengths Lp and Ln determined by the driving capability of the driver transistor QP3 and QN3 and the like, it is possible to realize a DRAM circuit 100 having a sense-amplifier region 3 in which the dead space is reduced as much as possible.

Figure 11:
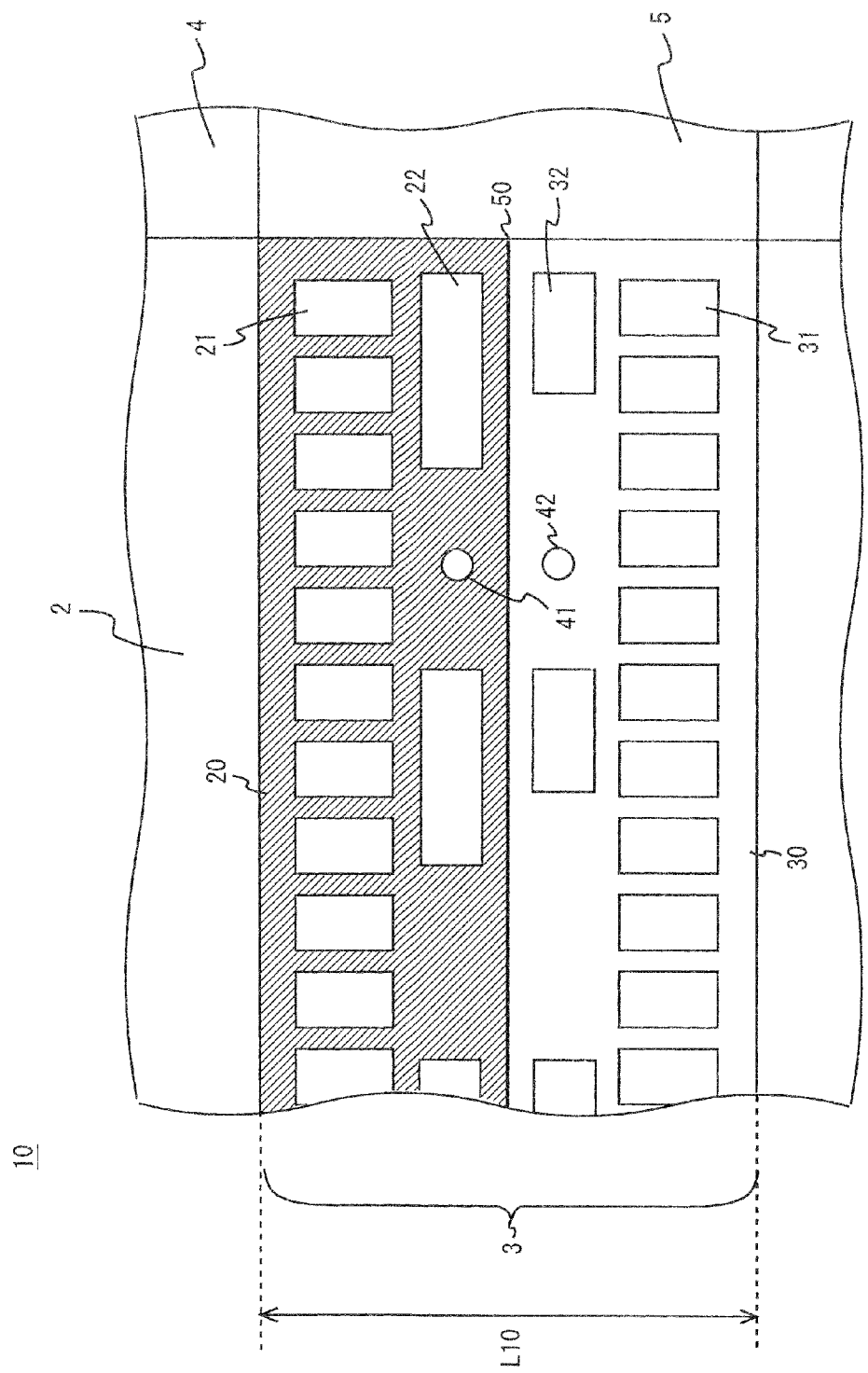
FIG. 11 is an example of a configuration of a semiconductor memory device in the related art.

In recent years, built-in DRAMs have been adopted in system LSIs and the likes. Furthermore, the power-supply voltage has decreased because of the miniaturization of DRAM circuits and the reduction in power requirements and the like. When the power-supply voltage is reduced, the driving capability of transistors constituting the above-described sense amplifier, and thus the operation speed of the sense amplifier are also lowered. Especially, the driving capability on the PMOS transistor side deteriorates due to difference in the carrier mobility and the like. Consequently, the PMOS transistor QP3, which is the driver transistor to supply the power-supply voltage to the PMOS transistor side, needs to be increased in size than the NMOS transistor QN3. Therefore, the requirement that the size of the PMOS transistor region 22 in which a PMOS transistor is formed be larger than that of the NMOS transistor region 32 in which a NMOS transistor is formed is becoming more significant. Therefore, as in the case of, for example, the DRAM circuit 10 in the prior art shown in FIG. 11, the dead space in the P-well region 30 has increasingly become larger in comparison to that in the N-well region 20 in the prior art. By contrast, in the DRAM circuit 100 in accordance with this exemplary embodiment of the present invention, even if the sizes of the PMOS transistor region 22 and the NMOS transistor region 32 are unbalanced, the N-well region 20 and the P-well region 30 can be still formed with the optimal lengths Lp and Ln for such unbalanced sizes. Therefore, since the PMOS transistor regions 22 and the NMOS transistor regions 32 can be disposed while effectively utilizing the dead space generated in the opposed well regions of the DRAM circuit 10, the width L100 of the sense-amplifier region 3 can be shortened in comparison to the width L10 of the DRAM circuit 10. In this way, the arrangement density between each element in the X-direction in FIG. 1 can be increased, and thereby the size of the sense-amplifier region 3 can be reduced. As a result, it is possible to reduce the chip size of the DRAM circuit 100. Note that the above-mentioned term "X-direction in FIG. 1" means a direction along which the bit lines (not shown) extend in the memory array regions 2.

Furthermore, the transistor regions 22 and 32 in which driver transistors QP3 and QN3 are formed are disposed between the PMOS transistor regions 21 and the NMOS transistor regions 31 in which the PMOS transistors QP1 and QP2 and the NMOS transistors QN1 and QN2, respectively, are formed. That is, the driver transistors QP3 and QN3 are disposed within the sense amplifier region 3, and the power supply is supplied to the PMOS transistors QP1 and QP2 and the NMOS transistors QN1 and QN2 by them. Therefore, the problem from which the DRAM circuit 10 in the prior art has suffered, i.e., the problem that the wiring resistance increases because the power supply is supplied from the driver transistors located outside the sense-amplifier region 3 can be solved.

Second Exemplary Embodiment

Figure 3:
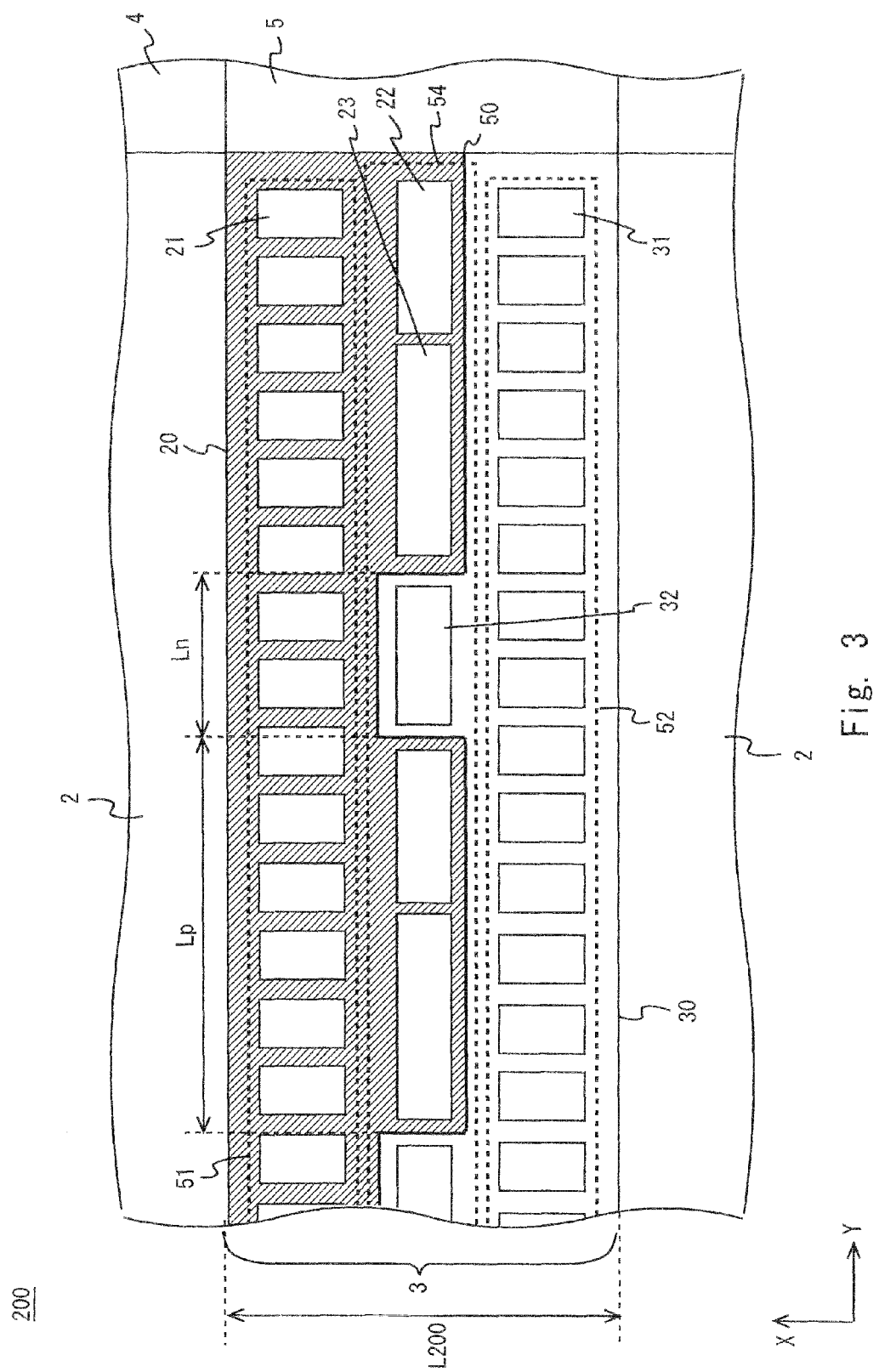
FIG. 3 shows an example of a configuration of a semiconductor memory device in accordance with a second exemplary embodiment of the present invention.
Figure 4:
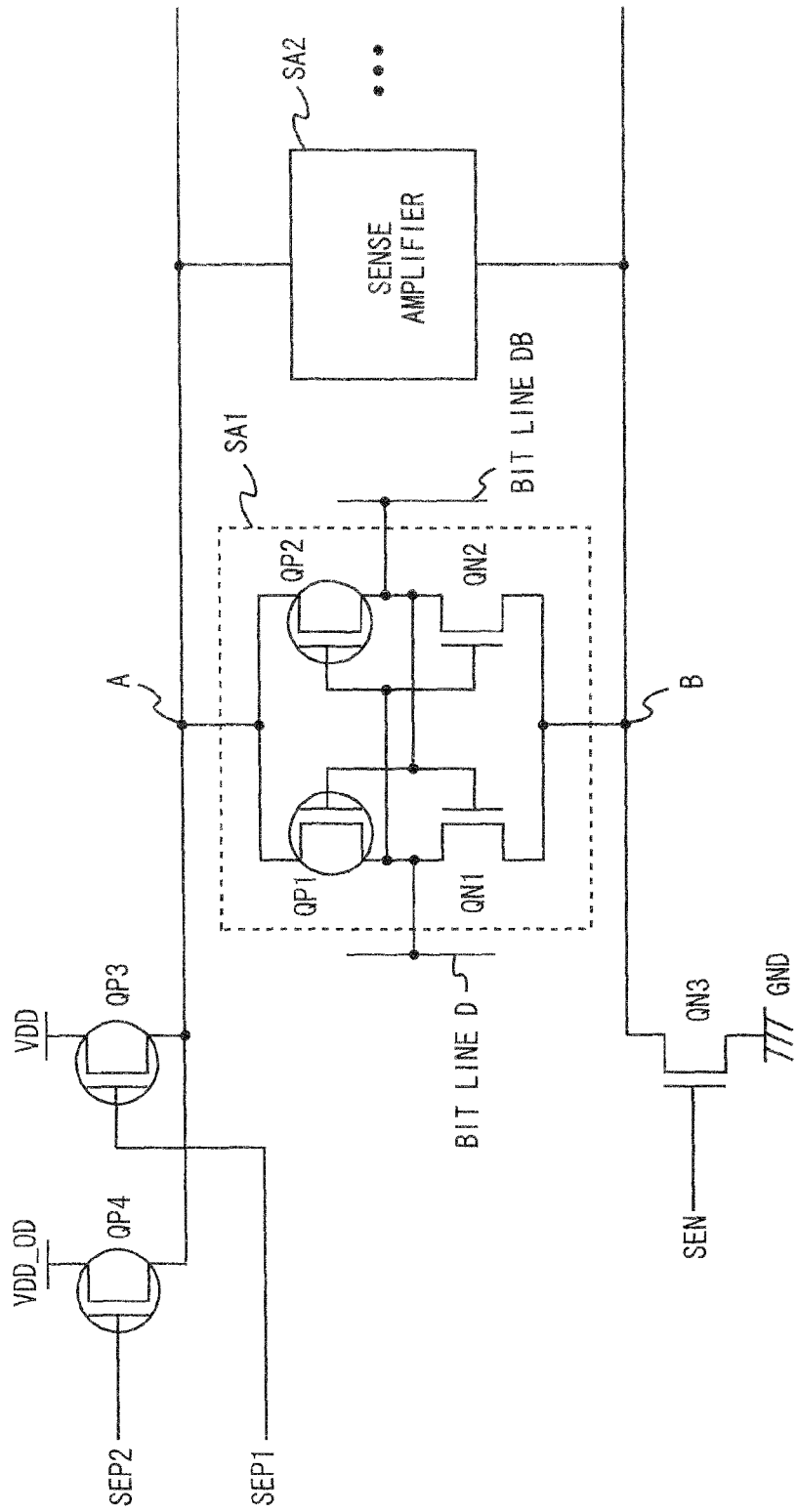
FIG. 4 is a circuit diagram of a semiconductor memory device in accordance with a second exemplary embodiment of the present invention.

A specific second exemplary embodiment to which the present invention is applied is explained hereinafter in detail with reference to the drawings. As in the case of the first exemplary embodiment, a semiconductor memory device in accordance with a second exemplary embodiment of the present invention is applied to a DRAM circuit. FIG. 3 shows an example of a configuration of a DRAM circuit 200 of a semiconductor memory device in accordance with a second exemplary embodiment of the present invention. Furthermore, FIG. 4 shows a connection configuration for a plurality of sense amplifiers and driver transistors to drive these sense amplifiers, both of which are formed in the sense-amplifier region 3 shown in FIG. 3. Note that components and structures having the same signs as those in FIGS. 1 and 12 represent identical or similar components and structures to those in FIGS. 1 and 12.

The difference between the second exemplary embodiment and the first exemplary embodiment lies in that the second exemplary embodiment includes a PMOS transistor QP4 as a driver transistor in addition to the PMOS transistor QP3. This PMOS transistor QP4 is a driver transistor that is used to overdrive the sense amplifiers SA1, SA2 . . . . Therefore, in the second exemplary embodiment of the present invention, this portion is selectively explained and explanation of other portions similar to those of the first exemplary embodiment is omitted.

As shown in FIG. 3, a DRAM circuit 200 includes an N-well region 20 and a P-well region 30 in the sense-amplifier region 3 of the chip. The N-well region 20 includes PMOS transistor regions 21, 22 and 23 in which PMOS transistors are formed. PMOS transistors QP1 and QP2 shown in FIG. 4 are formed in PMOS transistor regions 21. A PMOS transistor QP3 shown in FIG. 4 is formed in a PMOS transistor region 22. A PMOS transistor QP4 shown in FIG. 4 is formed in a PMOS transistor region 23. Explanation of the P-well region 30 is omitted because it is similar to that of the DRAM circuit 100.

As shown in FIG. 4, the PMOS transistor QP4 for over driving is connected between a power-supply voltage terminal VDD_OD that supplies a power-supply voltage VDD_OD higher than the power-supply voltage VDD and a node A. A sense-amplifier control signals SEP2 is input to the PMOS transistor QP4 in order to control its On-state and Off-state. Note that a sense-amplifier control signal SEP 1 that is substantially the same as the sense-amplifier control signal SEP of the first exemplary embodiment is input to the PMOS transistor QP3.

Figure 5:
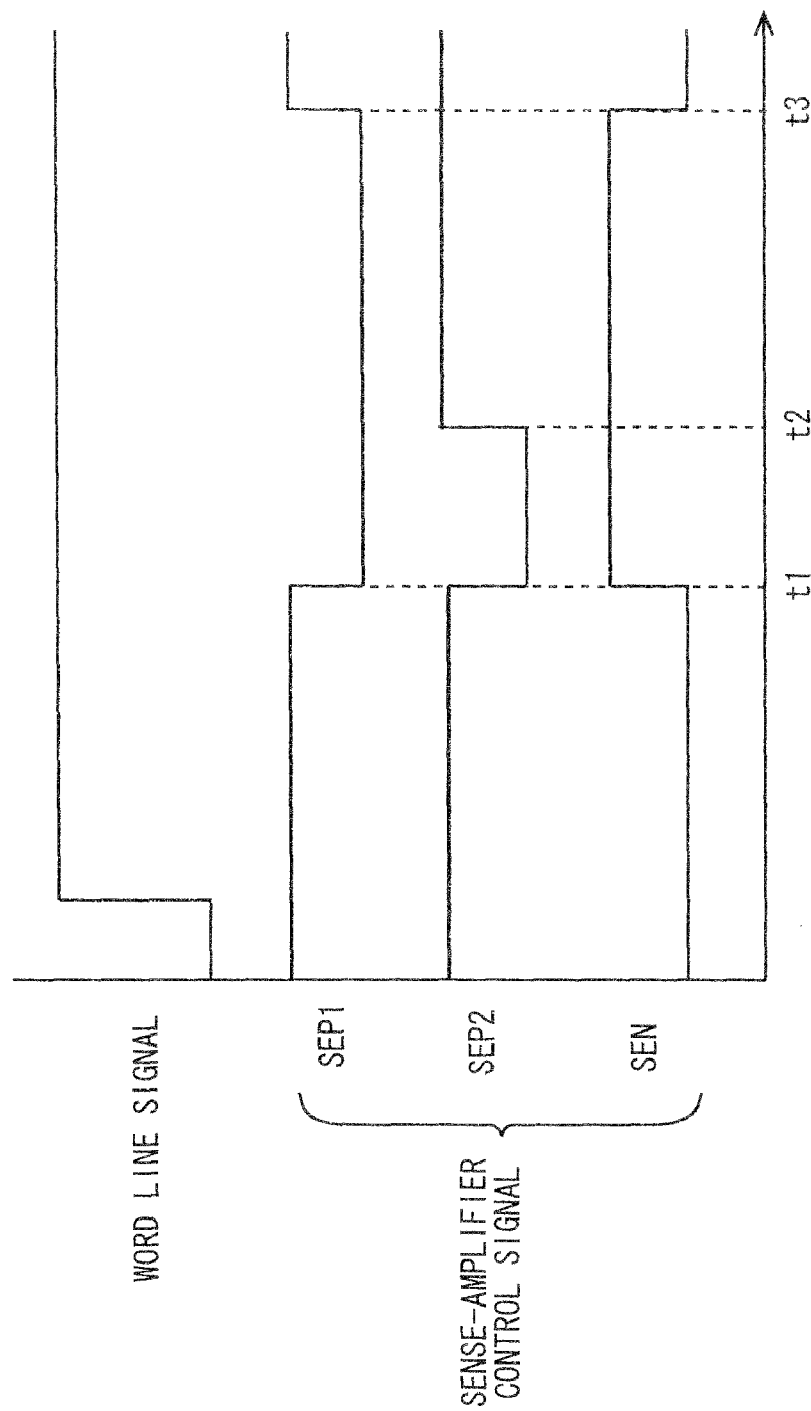
FIG. 5 is a timing chart of a sense amplifier in accordance with a second exemplary embodiment of the present invention.

Operations of the sense amplifier SA1 including a PMOS transistor QP4 for over driving are briefly explained with reference to FIG. 5. FIG. 5 is a timing chart of a sense amplifier SA1 when it is in an activated state. As shown in FIG. 5, the sense-amplifier control signals SEP1 and SEP2 become low-levels and the sense-amplifier control signal SEN becomes a high-level at a time t1. Therefore, the PMOS transistors QP3 and QP4 and the NMOS transistor QN3 become On-states, and thereby the sense amplifier SA1 begins to be activated.

The reasons why the PMOS transistor QP4 for overdriving is necessary includes the following one. In general, the current driving capability of a PMOS transistor is lower than that of an NMOS transistor, so that the speed of operations for amplifying potential difference of bit lines toward the power-supply voltage VDD side tends to deteriorate To avoid such a decrease in the speed, a power-supply voltage VDD_OD higher than the power-supply voltage VDD is supplied to the sources of PMOS transistors QP1 and QP2 in the early stage of an activated state of a sense amplifier SA1. Therefore, the PMOS transistor QP4, which is connected between the power-supply voltage VDD_OD and the node A, becomes necessary. Furthermore, since the current value of a current supplied from the power-supply voltage VDD_OD is large, the size of the PMOS transistor QP4 is larger than that of the PMOS transistor QP3.

Next, after a predefined time from the time t1, i.e., at a time t2, the sense-amplifier control signal SEP2 becomes a high-level, and thereby the PMOS transistor QP4 becomes an Off-state. This action is carried out in order to prevent any current supplied from the power-supply voltage VDD_OD from flowing to the power-supply voltage terminal VDD side. Finally, at a time t3, the sense-amplifier control signal SE1 and the sense-amplifier control signal SEP become a high-level and a low-level respectively, and thereby the activation of the sense amplifier SA1 is stopped.

The PMOS transistor QP4 described above is formed in the PMOS transistor region 23 shown in FIG. 3. As can be seen from FIG. 3, similarly to the PMOS transistor regions 22, the PMOS transistor regions 23 are also disposed between the P-type sense-amplifier array 51 and the N-type sense-amplifier array 52 in the N-well region 20. In this manner, the PMOS transistor regions 22 and 23 and the NMOS transistor regions 32 are arranged in a row in a driver transistor array region 54 located between the P-type sense-amplifier array 51 and the N-type sense-amplifier array 52 in FIG. 3.

Note that as in the case of the first exemplary embodiment, the lengths of the transistor regions 22, 23 and 32 in the X-direction can be freely established in accordance with the driving capability of the driver transistors QP3, QP4, and QN3. Further, the lengths Lp and Ln shown in FIG. 3 can be also freely established. Therefore, by forming the N-well region 20 and the P-well region 30 with the optimal lengths Lp and Ln determined by the driving capability of the driver transistor QP3, QP4, and QN3 and the like, it is possible to realize a DRAM circuit 200 having a sense-amplifier region 3 in which the dead space is reduced as much as possible.

By adopting a structure like this, the dead space in each well region can be reduced as in the case of the first exemplary embodiment, even though a region where the PMOS transistor QP4 for overdriving is formed is added. Therefore, the arrangement density between each element in the X-direction can be increased, and thereby the width L200 of the sense-amplifier region 3 can be shortened Consequently, as in the case of the first exemplary embodiment, the size of the sense-amplifier region 3 can be reduced, and as a result the chip size of the DRAM circuit 200 can be also reduced.

Furthermore, also as in the case of the first exemplary embodiment, the transistor regions 22 and 32 in which the PMOS transistors QP3 and QP4 and the NMOS transistor QN3 are formed as driver transistors are disposed between the PMOS transistor regions 21 and the NMOS transistor regions 31 in which the PMOS transistors QP1 and QP2 and the NMOS transistors QN1 and QN2, respectively, are formed. Therefore, the problem of the increased wiring resistance can be solved.

Third Exemplary Embodiment

Figure 6:
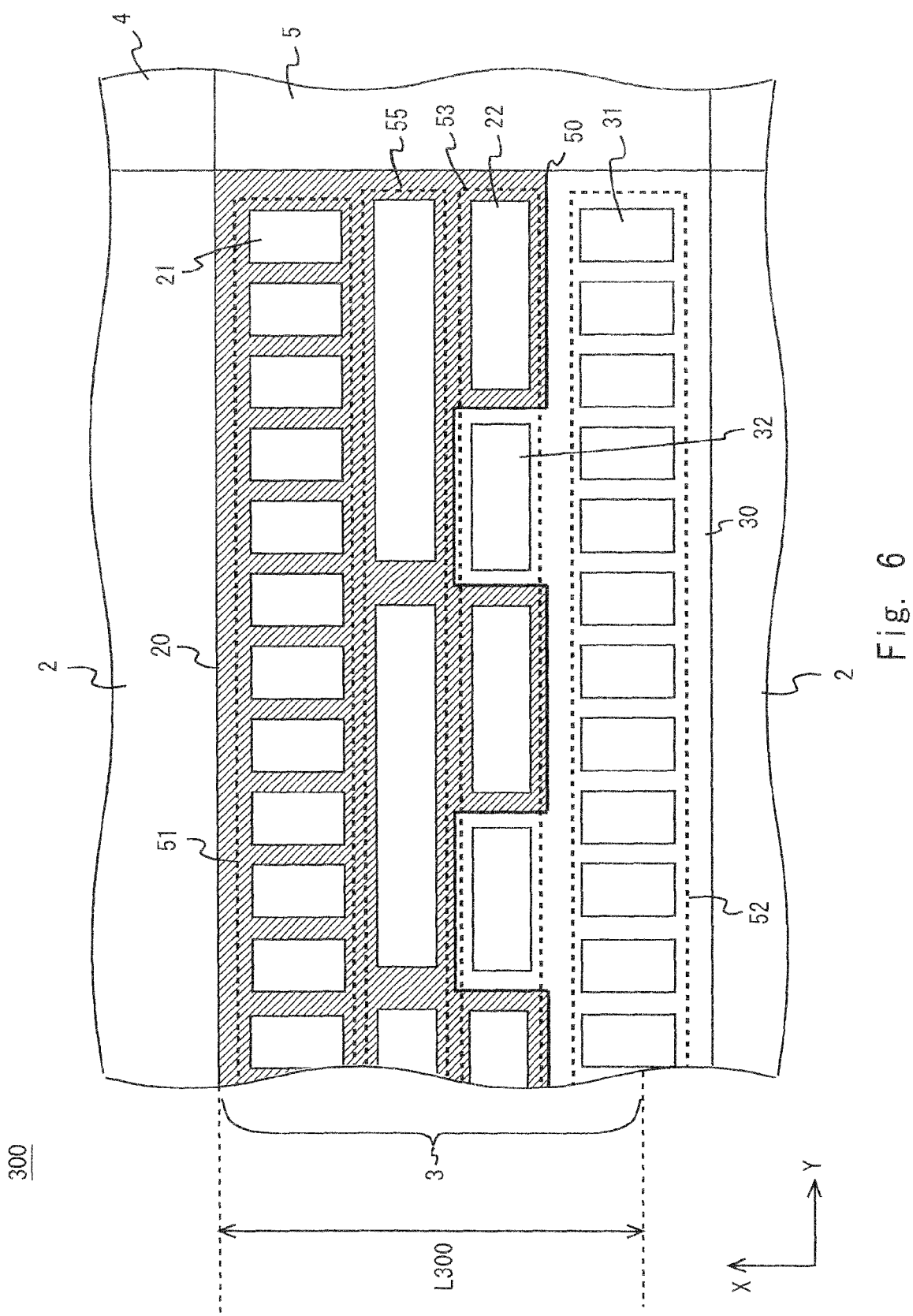
FIG. 6 shows an example of a configuration of a semiconductor memory device in accordance with a third exemplary embodiment of the present invention.

A specific third exemplary embodiment to which the present invention is applied is explained hereinafter in detail with reference to the drawings. As in the case of the first and second exemplary embodiments, a semiconductor memory device in accordance with a third exemplary embodiment of the present invention is applied to a DRAM circuit. FIG. 6 shows an example of a configuration of a DRAM circuit 300 of a semiconductor memory device in accordance with a third exemplary embodiment of the present invention. Note that components and structures having the same signs as those in FIGS. 1 and 3 represent identical or similar components and structures to those in FIGS. 1 and 3. The difference between the third exemplary embodiment and the second exemplary embodiment is the difference of the arrangement places of the PMOS transistor region 23 in which the PMOS transistor QP4 is formed. Therefore, in the third exemplary embodiment of the present invention, this portion is selectively explained and explanation of other portions similar to those of the second exemplary embodiment is omitted.

In a DRAM circuit 300 in accordance with a third exemplary embodiment of the present invention, the PMOS transistor QP4 is driven with a current still larger than that of the second exemplary embodiment. Therefore, this exemplary embodiment assumes a situation where the PMOS transistor region 23 in which the PMOS transistor QP4 is formed becomes so large that it is difficult to dispose the PMOS transistor region 23 within the driver transistor array region 54 shown in FIG. 3. In such a case, the PMOS transistor regions 23 are arranged in a row in a driver transistor array region 55 located between the driver transistor array region 53 in which the PMOS transistor regions 22 and the NMOS transistor regions 32 are arranged and the P-type sense-amplifier array 51.

As described above, when the PMOS transistor region 23 becomes too large, the PMOS transistor region 23 cannot be arranged in the same row as the PMOS transistor regions 22 and the NMOS transistor regions 32 in contrast to the DRAM circuit 200 in accordance with the second exemplary embodiment. Even in a situation like this, the PMS transistor regions 22 and the NMOS transistor regions 32 are arranged in the driver transistor array region 55. Therefore, similar advantageous effects to those in the first exemplary embodiment can be obtained. That is, the arrangement density between each element in the X-direction can be increased, and thereby the width L300 of the sense-amplifier region 3 can be shortened. Consequently, as in the case of the first exemplary embodiment, the size of the sense-amplifier region 3 can be reduced, and as a result the chip size of the DRAM circuit 300 can be also reduced Furthermore, the problem of the increased wiring resistance can be also solved for a similar reason to that of the second exemplary embodiment.

Fourth Exemplary Embodiment

Figure 7:
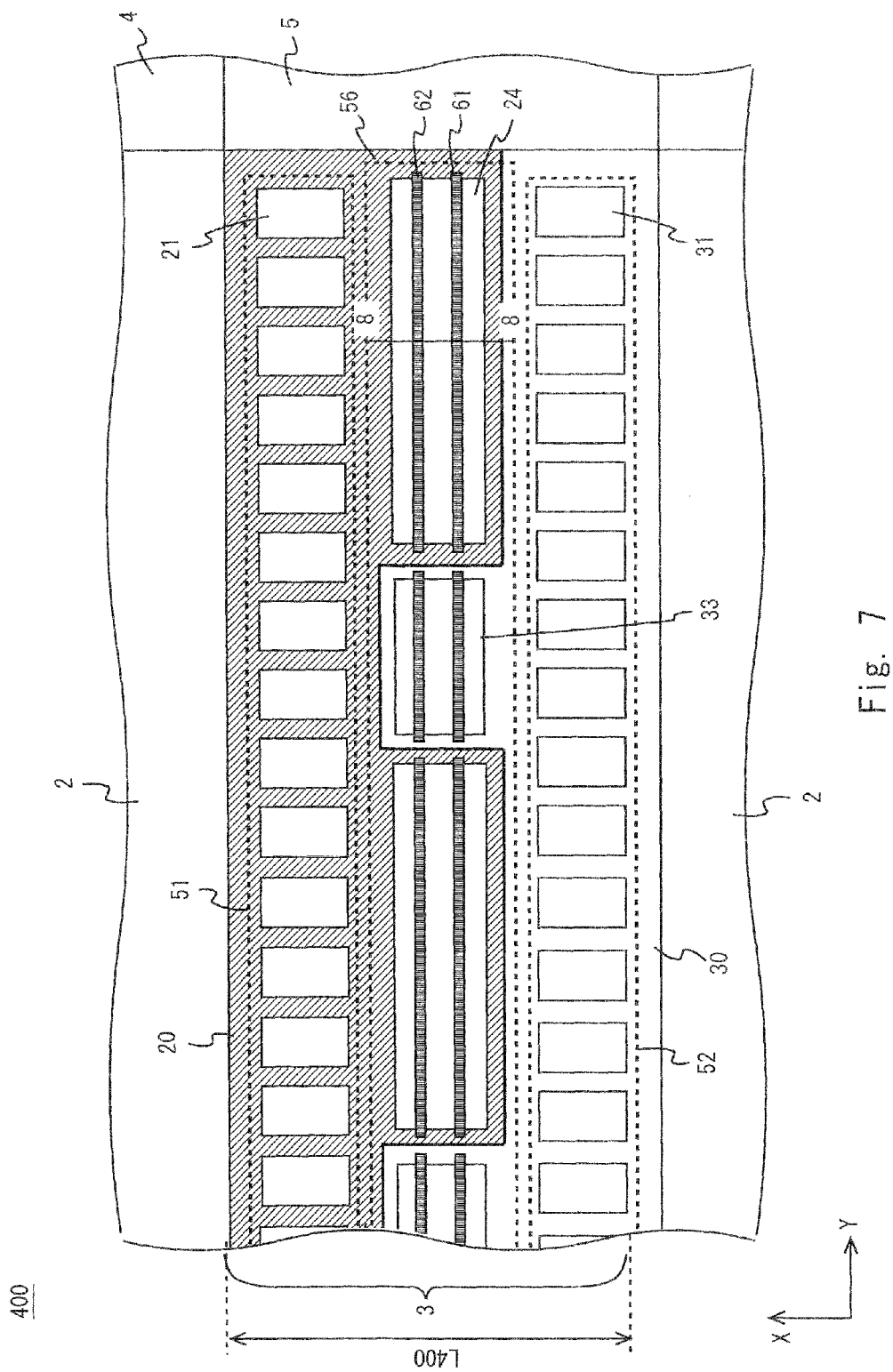
FIG. 7 shows an example of a configuration of a semiconductor memory device in accordance with a fourth exemplary embodiment of the present invention.

A specific fourth exemplary embodiment to which the present invention is applied is explained hereinafter in detail with reference to the drawings. As in the case of the first, second, and third exemplary embodiments, a semiconductor memory device in accordance with a fourth exemplary embodiment of the present invention is applied to a DRAM circuit. FIG. 7 shows an example of a configuration of a DRAM circuit 400 of a semiconductor memory device in accordance with a third exemplary embodiment of the present invention. Note that components and structures having the same signs as those in FIGS. 1, 3 and 6 represent identical or similar components and structures to those in FIGS. 1, 3 and 6. The difference between the fourth exemplary embodiment and the second and third exemplary embodiments lies in that a single drain is mutually shared by PMOS transistors QP3 and QP4 in the configuration of the fourth exemplary embodiment. Therefore, in the fourth exemplary embodiment of the present invention, this portion is selectively explained and explanation of other portions similar to those of the second and third exemplary embodiments is omitted.

As shown in FIG. 7, the DRAM circuit 400 includes an N-well region 20 and a P-well region 30 in the sense-amplifier region 3 of the chip. The N-well region 20 includes PMOS transistor regions 21 and 24 in which PMOS transistors are formed. The P-well region 30 includes NMOS transistor regions 31 and 33 in which NMOS transistors are formed. Explanation of the PMOS transistor region 21 and the NMOS transistor region 31 is omitted because they are similar to those of the first exemplary embodiment In the PMOS transistor region 24, PMOS transistors QP3 and QP4 are formed as driver transistors. In the NMOS transistor region 33, an NMOS transistor QN3 is formed as a driver transistor.

Figure 8:
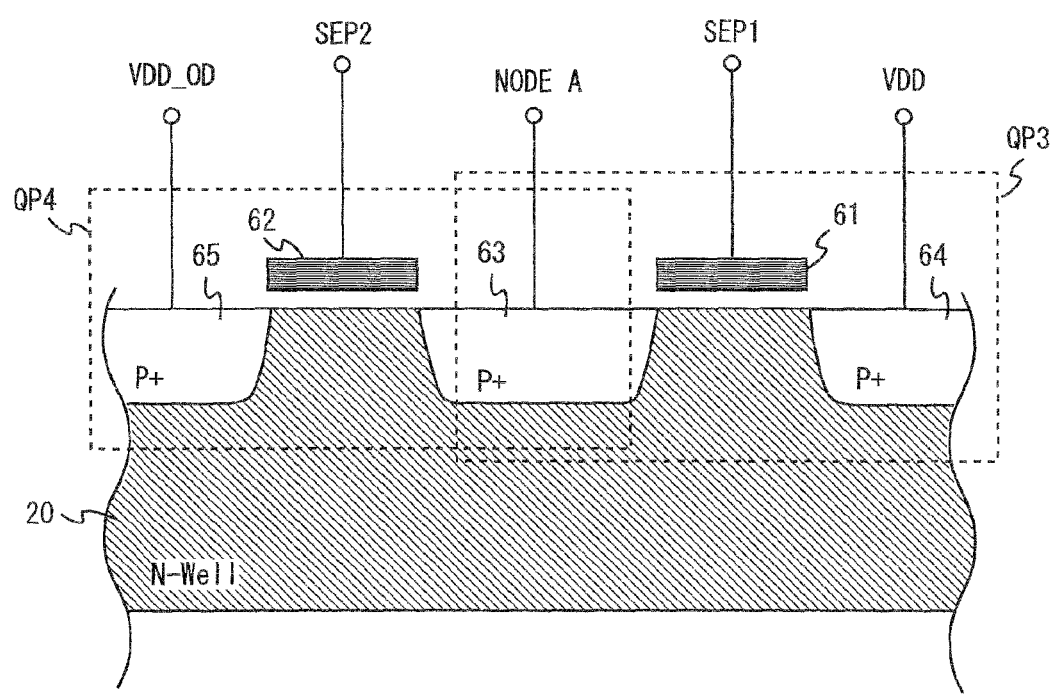
FIG. 8 shows a cross-sectional structure of a semiconductor memory device in accordance with a fourth exemplary embodiment of the present invention.

FIG. 8 shows the cross section of the PMOS transistor region 24. This cross section is a surface taken along the line 8-8 in FIG. 7 and viewed in the Y-direction. As described above, PMOS transistors QP3 and QP4 are formed in the PMOS transistor region 24. The portion indicated by a dashed-line box QP3 in FIG. 8 is the PMOS transistor QP3, and the portion indicated by a dashed-line box QP3 is the PMOS transistor QP4. As shown in FIG. 8, the PMOS transistor QP3 is composed of a gate electrode 61 formed over the N-well region 20 with a gate oxide film (riot shown) interposed therebetween, and a P-type source diffusion region 64 and a drain diffusion region 63 formed on both sides of the gate electrode. Similarly, the PMOS transistor QP4 is composed of a gate electrode 62 formed over the N-well region 20 with a gate oxide film (not shown) interposed therebetween, and a P-type source diffusion region 65 and the drain diffusion region 63 formed on both sides of that gate electrode. Therefore, the drain diffusion region 63 is connected to a node A, and the source diffusion regions 64 and 65 are connected to the power-supply voltage terminals VDD and VDD_OD respectively. Sense-amplifier control signals SEP1 and SEP2 are input to the gate electrodes 61 and 62 respectively.

As described above, the PMOS transistors QP3 and QP4 use the drain diffusion region 63 as a common drain. Therefore, two PMOS transistors can be formed in one PMOS transistor region 24. Furthermore, as shown in FIG. 8, by lining up the gate electrodes 61 and 62 in the X-direction and using the drain diffusion region 63 located between those gate electrodes 61 and 62 as a common drain, the total lengths of the PMOS transistors QP3 and QP4 in the X direction can be shortened in comparison to the arrangement where they are formed in separate PMOS transistor regions.

Note that explanation of the NMOS transistor region 33 is omitted because it has a similar configuration except that it has the opposite conductive type. Note that, however, a sense-amplifier control signal SEN is input to the gate electrode formed over the NMOS transistor region 33.

As has been described above, the PMOS transistor region 24 and the NMOS transistor region 33 described above are arranged in a driver transistor array region 56 shown in FIG. 8. This driver transistor array region 56 is located between the P-type sense-amplifier array 51 and the N-type sense amplifier array 52. By adopting a structure like this, it becomes unnecessary to adopt a two-row configuration for the PMOS transistor region in contrast to the DRAM circuit 300 in accordance with the third exemplary embodiment, even when the PMOS transistor QP4 for overdriving is somewhat large. Therefore, it can be reduced by an amount corresponding to the width of the drain region in the X direction and distance between elements. Therefore, the arrange merit density between each element in the X-direction can be further increased, and thereby the width L400 of the sense-amplifier region 3 can be further shortened in comparison to the DRAM circuit 300. Consequently, as in the case of the first to fourth exemplary embodiments, the size of the sense-amplifier region 3 can be reduced, and as a result the chip size of the DRAM circuit 400 can be also reduced. Furthermore, the problem of the increased wiring resistance can be also solved for a similar reason to that of the second exemplary embodiment.

Figure 9:
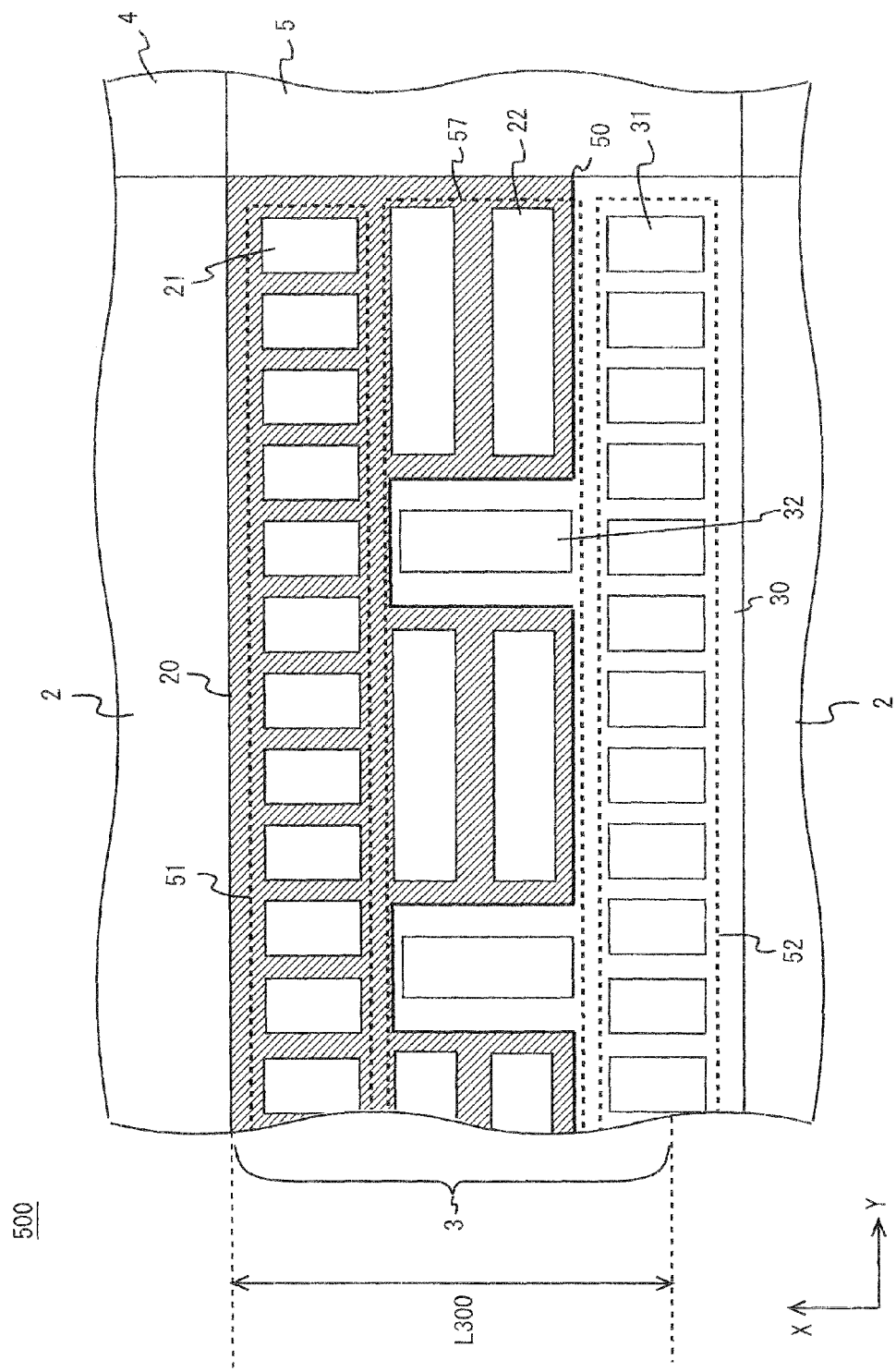
FIG. 9 shows an example of a configuration of a semiconductor memory device in accordance with another exemplary embodiment of the present invention.

It should be noted that the present invention is not limited to above-described exemplary embodiments, and modifications can be made as appropriate without departing from the spirit and scope of the present invention For example, the drain/source diffusion regions of the NMOS transistor region 33 are formed so as to be arranged in the X-direction in the second to fourth exemplary embodiments of the present invention. However, as shown in a DRAM circuit 500 shown in FIG. 9, the drain/source diffusion regions of the NMOS transistor region 33 may be formed so as to be arranged in the Y-direction. In such a case, as shown in the DRAM circuit 500, even when the PMOS transistor region 23 and the PMOS transistor region 24 require large areas, the NMOS transistor regions 33 can be arranged within a driver transistor array region 57.

Furthermore, although the PMOS transistor QP4 for overdriving is used only on the driving side for the PMOS transistors QP1 and QP2 in the second to fourth exemplary embodiments of the present invention, an NMOS transistor for overdriving may be used on the driving side for the NMOS transistors QN1 and QN2 instead. In such a case, an NMOS transistor region forming that NMOS transistor for overdriving is disposed in the P-well region in a similar arrangement to that for the PMOS transistor regions 23 and 24.

The first to fourth exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A semiconductor memory device comprising:
   sense amplifiers that drive bit lines to which memory cells are connected; and
   driver transistors that supply a power supply to the sense amplifiers, wherein
   the sense amplifiers are arranged in rows and constitute a first sense-amplifier row in which transistors of a first conductive type are arranged and a second sense-amplifier row in which transistors of a second conductive type are arranged, and
   the driver transistors constitute at least one transistor row comprised of aligned alternating adjacent first and second conductive type well regions and including both first driver transistors of the first conductive type corresponding to the first sense-amplifier row and second driver transistors of the second conductive type corresponding to the second sense-amplifier row such that a second conductive type well region of said first driver transistors is located in line with and adjacently between two first conductive type well regions of two said second driver transistors, the at least one transistor row being located between the first sense-amplifier row and the second sense-amplifier row.

2. The semiconductor memory device according to claim 1, wherein
   the first driver transistor and the transistors having the first conductive type in the first sense-amplifier row are formed in the same first well having the second conductive type, and
   the second driver transistor and the transistors having the second conductive type in the second sense-amplifier row are formed in the same second well having the first conductive type.

3. The semiconductor memory device according to claim 2, wherein
   the first well is provided with a plurality of mutually-separated convex-shaped rectangular extension regions protruding toward the second well side,
   the second well is provided with a plurality of convex-shaped rectangular extension regions protruding toward the first well side between the convex-shaped rectangular extension regions of the first well, and
   the first driver transistor is formed in a convex-shaped rectangular extension region of the first well and the second driver transistor is formed in a convex-shaped rectangular extension region of the second well.

4. The semiconductor memory device according to claim 1, wherein the driver transistors further comprise a third driver transistor of the first conductive type corresponding to the first sense-amplifier row and the driver transistors constitute at least one transistor row including the first to third driver transistors between the first sense-amplifier row and the second sense-amplifier row.

5. The semiconductor memory device according to claim 4, wherein the first and third driver transistors share a drain or a source and are arranged in the same row as a transistor row including the second driver transistor.

6. The semiconductor memory device according to claim 4, wherein
   the first driver transistor supplies a first power-supply voltage to a transistor of the first conductive type in the first sense-amplifier row, and
   the third driver transistor supplies a voltage higher or lower than the first power-supply voltage to a transistor of the first conductive type in the first sense-amplifier row.

7. The semiconductor memory device according to claim 4, wherein
   the first and third driver transistors and transistors of the first conductive type in the first sense-amplifier row are formed in a same first well of the second conductive type, and
   the second driver transistor and transistors of the second conductive type in the second sense-amplifier row are formed in a second well of the first conductive type.

8. The semiconductor memory device according to claim 7, wherein
   the first well is provided with a plurality of mutually-separated convex-shaped rectangular extension regions protruding toward the second well side,
   the second well is provided with a plurality of convex-shaped rectangular extension regions protruding toward the first well side between the convex-shaped rectangular extension regions of the first well, and
   the first driver transistor or both the first and third driver transistors are formed in a convex-shaped rectangular extension region of the first well and the second driver transistor is formed in a convex-shaped rectangular extension region of the second well.

9. The semiconductor memory device according to claim 1, wherein
   the driver transistors further comprise a third driver transistor of the first conductive type corresponding to the first sense-amplifier row between the first sense-amplifier row and the second sense-amplifier row, and
   the third driver transistor is arranged in a different row from a transistor row including the first and second driver transistors.

10. The semiconductor memory device according to claim 1, wherein,
    said second conductive type well regions of said first driver transistors are contiguous with second conductive type well regions of said first sense-amplifier row with transistors of the first conductive type, and
said of first conductive type well regions of said second driver transistors are contiguous with first conductive type well regions of said second sense-amplifier row with transistors of the second conductive type.

11. The semiconductor memory device according to claim 10, further comprising an element separation region defining a boundary line separating the adjacent first and second conductive type well regions.

12. The semiconductor memory device according to claim 11, wherein,
said separation region defines the adjacent first and second conductive type well regions as:
first wells provided with a plurality of mutually-separated convex-shaped rectangular extension regions protruding toward the second well side, and
second wells provided with a plurality of convex-shaped rectangular extension regions protruding toward the first well side between the convex-shaped rectangular extension regions of the first well, wherein,
the first driver transistors are formed in the convex-shaped rectangular extension regions of the first wells and the second driver transistors are formed in the convex-shaped rectangular extension regions of the second wells.

13. The semiconductor memory device according to claim 1, further comprising an element separation region defining a boundary line separating the adjacent first and second conductive type well regions.

14. The semiconductor memory device according to claim 13, wherein,
said separation region defines the adjacent first and second conductive type well regions as:
first wells provided with a plurality of mutually-separated convex-shaped rectangular extension regions protruding toward the second well side, and
second wells provided with a plurality of convex-shaped rectangular extension regions protruding toward the first well side between the convex-shaped rectangular extension regions of the first well, wherein,
the first driver transistors are formed in the convex-shaped rectangular extension regions of the first wells and the second driver transistors are formed in the convex-shaped rectangular extension regions of the second wells.

15. A semiconductor memory device comprising:
a sense-amplifier row arranged in a first direction;
a driver-transistor row that supplies a voltage to the sense-amplifier row, the driver-transistor row being arranged in parallel with the first direction and comprised of plural alternating first conductive type well regions of second conductive type driver transistors and second conductive type well regions of first conductive type driver transistors such that each first conductive type well region is located in line with and adjacently between two second conductive type well regions; and
an element separation region continuously extending from the first direction so as to cross the driver transistor row in a direction intersecting the first direction, the element separation region defining a boundary line separating the adjacent first and second conductive type well regions.

16. The semiconductor memory device according to claim 15, further comprising a first well and a second well supplied with different potentials,
wherein the element separation region separates the first well from the second well.

17. The semiconductor memory device according to claim 15, wherein,
said second conductive type well regions of said first conductive type driver transistors are contiguous with second conductive type well regions of a corresponding first sense-amplifier row with transistors of the first conductive type, and
said first conductive type well regions of said second conductive type driver transistors are contiguous with first conductive type well regions of a corresponding second sense-amplifier row with transistors of the second conductive type.

18. A semiconductor memory device, comprising:
sense amplifiers driving bit lines to which memory cells are connected, the sense amplifiers having i) a first transistor region in which transistors of a first conductive type are arranged, and ii) a second transistor region in which transistors of a second conductive type are arranged,
the first transistor region extending in a first direction in parallel with the second transistor region;
driver transistors supplying a power supply to the sense amplifiers, the driver transistors having i) a first driver transistor region in which at least one transistor of the first conductive type are arranged between the first and second transistor regions, and ii) a second driver transistor region in which at least one transistor of the second conductive type are arranged between the first and second transistor regions,
the first driver transistor region having a first point,
the second driver transistor region having a second point,
the first and second points aligned on a straight line parallel to the first direction.

19. The semiconductor memory device according to claim 18, further comprising:
an element separation region continuously extending from the first direction through between the first and second driver transistor regions.

* * * * *